(12) United States Patent
Althaus et al.

(10) Patent No.: US 11,579,326 B2
(45) Date of Patent: Feb. 14, 2023

(54) NUCLEAR MAGNETIC RESONANCE METHOD QUANTIFYING FRACTURES IN UNCONVENTIONAL SOURCE ROCKS

(71) Applicant: ARAMCO SERVICES COMPANY, Houston, TX (US)

(72) Inventors: Stacey Marie Althaus, Houston, TX (US); Jin-Hong Chen, Katy, TX (US); Mohammed Boudjatit, El Kennar (DZ)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 0 days.

(21) Appl. No.: 17/197,696

(22) Filed: Mar. 10, 2021

(65) Prior Publication Data

US 2022/0291411 A1   Sep. 15, 2022

(51) Int. Cl.
| G01V 3/32 | (2006.01) |
| G01R 33/50 | (2006.01) |
| G01N 24/08 | (2006.01) |

(52) U.S. Cl.
CPC ............ *G01V 3/32* (2013.01); *G01N 24/081* (2013.01); *G01R 33/50* (2013.01)

(58) Field of Classification Search
CPC ......... G01R 33/50; G01N 24/081; G01V 3/32
See application file for complete search history.

(56) References Cited

U.S. PATENT DOCUMENTS

| 7,180,288 | B2 | 2/2007 | Scheven |
| 10,161,891 | B1 | 12/2018 | Tian et al. |
| 10,697,295 | B2 | 6/2020 | Buono et al. |
| 10,761,157 | B2 | 9/2020 | Chen et al. |
| 2011/0204892 | A1* | 8/2011 | Li ..................... G01N 24/081 324/309 |
| 2013/0234703 | A1* | 9/2013 | Chen ................. G01N 24/081 324/303 |
| 2016/0334347 | A1* | 11/2016 | Valori ................ G01R 33/448 |
| 2016/0341652 | A1 | 11/2016 | Liu et al. |

(Continued)

FOREIGN PATENT DOCUMENTS

| CN | 100373172 C | 3/2008 |
| CN | 102954978 A | 3/2013 |
| CN | 106248712 A | 12/2016 |

(Continued)

OTHER PUBLICATIONS

Balcom, B.J. et al., "Single-Point Ramped Imaging with T1 Enhancement (SPRITE)", Article No. 0225, Journal of Magnetic Resonance, Series A, Academic Press, Inc., vol. 123, 1996, pp. 131-134 (4 pages).

(Continued)

*Primary Examiner* — Gregory H Curran
(74) *Attorney, Agent, or Firm* — Osha Bergman Watanabe & Burton LLP (57) ABSTRACT

A method for analyzing unconventional rock samples using nuclear magnetic resonance (NMR), tracking fluid change in the rock sample over a time period, calculating transverse relaxation time ($T_2$) generating fluid distribution profiles by the computer processor and based on a NMR imaging, where the fluid distribution profiles representing a movement of the fluid, and obtaining, quantification of fracture volume by the computer processor and based on the NMR imaging.

20 Claims, 9 Drawing Sheets

(56) References Cited

U.S. PATENT DOCUMENTS

2016/0341680 A1\* 11/2016 Kadayam Viswanathan ............... G01N 24/081

FOREIGN PATENT DOCUMENTS

| CN | 105241913 B | 6/2017 |
|---|---|---|
| CN | 106404548 B | 6/2019 |
| CN | 209400451 U | 9/2019 |
| CN | 111305805 A | 6/2020 |
| CN | 111337408 A | 6/2020 |
| CN | 110702570 B | 8/2020 |
| WO | 2012148679 A1 | 11/2012 |
| WO | 2019157413 A1 | 8/2019 |

OTHER PUBLICATIONS

Carr, H.Y. and E.M. Purcell, "Effects of Diffusion on Free Precession in Nuclear Magnetic Resonance Experiments", Physical Review, vol. 94, No. 3, May 1954, pp. 630-638 (13 pages).

Chi, Lu and Zoya Heidari, "Quantifying the Impact of Natural Fractures and Pore Structure on NMR Measurements in Multiple-Porosity Systems", IPTC 17688, International Petroleum Technology Conference, Jan. 2014, pp. 1-12 (12 pages).

Grayson, Steve et al., "NMR-Enhanced Natural Fracture Evaluation in the Monterey Shale", SPWLA 56th Annual Logging Symposium, Society of Petrophysicists and Well Log Analysts, Jul. 2015, pp. 1-11 (11 pages).

Kumar, Arun T.A. et al., "Measurement of Aperture and Multiphase Flow in Fractures With NMR Imaging", SPE Formation Evaluation, Society of Petroleum Engineers, Jun. 1997, pp. 101-107 (7 pages).

Li, Song et al., "Advanced charaterization of physical properties of coals with different coal structures by nuclear magnetic resonance and X-ray computed tomography", Computers & Geosciences, ScienceDirect, Elsevier Ltd., vol. 48, Jan. 2012, pp. 220-227 (8 pages).

Veselinovic, Dragan et al., "Determination of Natural Fracture Porosity using NMR", URTeC: 2447768, Unconventional Resources Technology Conference, Aug. 2016, pp. 1-8 (8 pages).

Wang, Hai-Jing et al., "High-Field Nuclear Magnetic Resonance Observation of Gas Shale Fracturing by Methane Gas", Energy & Fuels, ACS Publications, American Chemical Society, vol. 28, Apr. 2014, pp. 3638-3644 (7 pages).

International Search Report and Written Opinion issued in corresponding International Patent Application No. PCT/US2022/019771, dated Jul. 5, 2022 (19 pages).

Baraka-Lokmane S. et al., "Influence of open and sealed fractures on fluid flow and water saturation in sandstone cores using Magnetic Resonance Imaging", Geophys. J. Int., vol. 147, No. 2, p. 263-271, 2001 (9 pages).

Cheng Zhilin et al, "New insights into spontaneous imbibition in tight oil sandstones with NMR", Journal of Petroleum Science and Engineering, vol. 179, pp. 455-464, 2019 (10 pages).

Lai Fengpeng et al, "Experimental Investigation of Spontaneous Imbibition in a Tight Reservoir with Nuclear Magnetic Resonance Testing", Energy & Fuels, vol. 30, No. 11, pp. 8932-8940, 2016 (9 pages).

Chen Songhua et al, "Characterization of Fractured Permeable Porous Media Using Relaxation-Weighted maging Techniques", Magnetic Resonance Imaging, vol. 13, No. 4, pp. 599-606, 1995 (8 pages).

\* cited by examiner

Fractured

FIG. 5A

No Fracture

NUCLEAR MAGNETIC RESONANCE METHOD QUANTIFYING FRACTURES IN UNCONVENTIONAL SOURCE ROCKS

BACKGROUND

Fluid flow is one of the most important properties in describing a reservoir and determining its production. It is important in producing unconventional tight reservoirs, including shale reservoirs, which generally have extremely low matrix permeability. In these reservoirs, the presence of fractures significantly enhances the flow capability. Fluid movement is much faster through the fractures than through the pore networks for tight formation rocks. In fracture-free, nanoporous samples, such as shales, it would take months for the fluid to flow from one side of a rock sample to the other without applying an external pressure gradient across the sample. If fluid is able to break through the sample in a short amount of time (e.g., 1-2 days), then such fast flow may be attributed to fractures that exist along the sample.

Nuclear magnetic resonance (NMR) spectroscopy and imaging has long been used to measure the rock and fluid property of conventional and unconventional rocks such as porosity, water and hydrocarbon saturation, and pore size distribution. Further, NMR may track the temporal and spatial changes of fluids into the rock samples.

SUMMARY

In general, in one aspect, the invention relates to a method for analyzing unconventional rock samples. A method includes introducing fluid to a rock sample, acquiring, by a computer processor, nuclear magnetic resonance (NMR) measurements of the rock sample to track fluid change in the rock sample, calculating transverse relaxation time ($T_2$) based on the NMR measurements, generating, by the computer processor and based on a NMR imaging, fluid distribution profiles, the fluid distribution profiles representing a movement of the fluid, and obtaining, by the computer processor and based on the NMR imaging, a quantification of fracture volume, the quantification of the fracture volume representing an amount of fluid in a fracture.

In general, in one aspect, the invention relates to a computer system for analyzing unconventional rock samples. A computer system a processor and a memory coupled to the processor, the memory storing instructions, when executed, comprising functionality for acquiring nuclear magnetic resonance (NMR) measurements of a rock sample, generating, based on NMR imaging, fluid distribution profiles, the fluid distribution profiles representing a movement of the fluid in the rock sample, and obtaining, based on NMR imaging, a quantification of fracture volume, the quantification of the fracture volume representing the amount of the fluid in a fracture of the rock sample.

In general, in one aspect, the invention relates to a non-transitory computer readable medium storing program instructions, that when executed, are configured to perform a method for analyzing unconventional rock samples. The instructions, when executed, are acquiring Nuclear magnetic resonance (NMR) measurements of the rock sample, generating, based on NMR imaging, a fluid distribution profiles, the fluid distribution profiles representing a movement of the fluid front, and obtaining, based on NMR imaging, a quantification of fracture volume, the quantification the quantification of the fracture volume representing the amount of the fluid in a fracture.

BRIEF DESCRIPTION OF DRAWINGS

Specific embodiments disclosed herein will now be described in detail with reference to the accompanying figures. Like elements in the various figures are denoted by like reference numerals for consistency. Like elements may not be labeled in all figures for the sake of simplicity.

DETAILED DESCRIPTION

In the following detailed description of embodiments disclosed herein, numerous specific details are set forth in order to provide a more thorough understanding disclosed herein. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-7, any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that, one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

Embodiments of the invention provide a method, a computer system, and a non-transitory computer readable medium for quantifying fractures in unconventional source rocks. Nuclear magnetic resonance (NMR) may track the temporal and spatial changes of fluids into the rock samples. Fluid movement is much faster through the fractures than through the pore networks for tight formation rocks. In fracture free nanoporous samples, such as shales, it may take months for the fluid to flow from one side of the core to the other without applying an external pressure gradient across the sample. In cases where the fluid is able to break through the sample in a short amount of time, then it must be attributed to fractures that exist along the sample.

Figure 1:
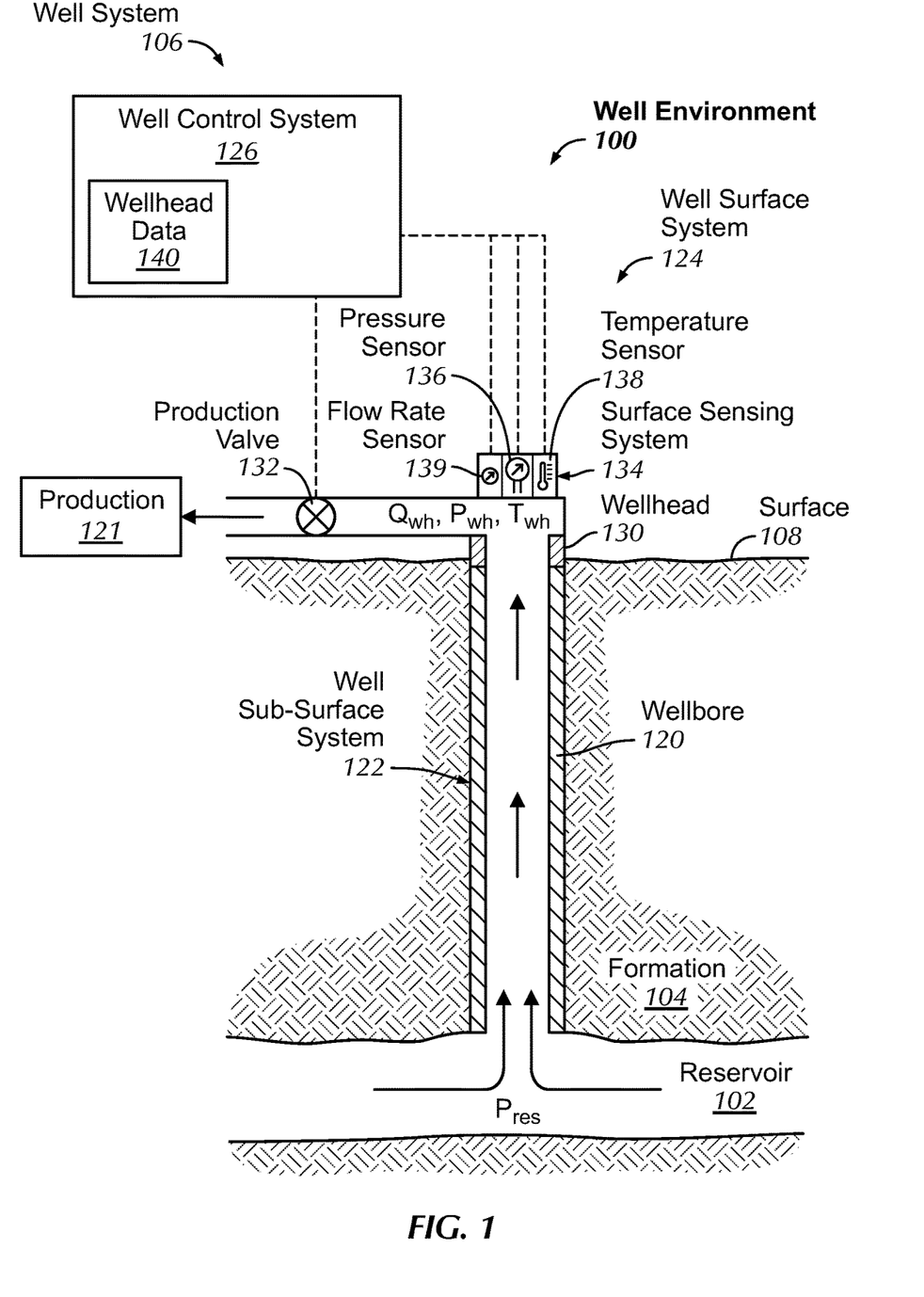
FIG. 1 shows a system in accordance with one or more embodiments.

Turning to FIG. 1, FIG. 1 shows a schematic diagram in accordance with one or more embodiments. As shown in FIG. 1, FIG. 1 illustrates a well environment (100) that includes a hydrocarbon reservoir ("reservoir") (102) located in a subsurface hydrocarbon-bearing formation ("formation") (104) and a well system (106). The hydrocarbon-bearing formation (104) may include a porous or fractured rock formation that resides underground, beneath the earth's surface ("surface") (108). In the case of the well system (106) being a hydrocarbon well, the reservoir (102) may include a portion of the hydrocarbon-bearing formation (104). The hydrocarbon-bearing formation (104) and the reservoir (102) may include different layers of rock having varying characteristics, such as varying degrees of permeability, porosity, capillary pressure, and resistivity. In the case of the well system (106) being operated as a production well, the well system (106) may facilitate the extraction of hydrocarbons (or "production") from the reservoir (102).

In some embodiments, the well system (106) includes a wellbore (120), a well sub-surface system (122), a well surface system (124), and a well control system ("control system") (126). The control system (126) may control various operations of the well system (106), such as well production operations, well completion operations, well maintenance operations, and reservoir monitoring, assessment and development operations. In some embodiments, the control system (126) includes a computer system that is the same as or similar to that of computer system (700) described below in FIG. 7 and the accompanying description.

The wellbore (120) may include a bored hole that extends from the surface (108) into a target zone of the hydrocarbon-bearing formation (104), such as the reservoir (102). An upper end of the wellbore (120), terminating at or near the surface (108), may be referred to as the "up-hole" end of the wellbore (120), and a lower end of the wellbore, terminating in the hydrocarbon-bearing formation (104), may be referred to as the "down-hole" end of the wellbore (120). The wellbore (120) may facilitate the circulation of drilling fluids during drilling operations, the flow of hydrocarbon production ("production") (121) (e.g., oil and gas) from the reservoir (102) to the surface (108) during production operations, the injection of substances (e.g., water) into the hydrocarbon-bearing formation (104) or the reservoir (102) during injection operations, or the communication of monitoring devices (e.g., logging tools) into the hydrocarbon-bearing formation (104) or the reservoir (102) during monitoring operations (e.g., during in situ logging operations).

In some embodiments, during operation of the well system (106), the control system (126) collects and records wellhead data (140) for the well system (106). The wellhead data (140) may include, for example, a record of measurements of wellhead pressure ($P_{wh}$) (e.g., including flowing wellhead pressure), wellhead temperature ($T_{wh}$) (e.g., including flowing wellhead temperature), wellhead production rate ($Q_{wh}$) over some or all of the life of the well (106), and water cut data. In some embodiments, the measurements are recorded in real-time, and are available for review or use within seconds, minutes or hours of the condition being sensed (e.g., the measurements are available within 1 hour of the condition being sensed). In such an embodiment, the wellhead data (140) may be referred to as "real-time" wellhead data (140). Real-time wellhead data (140) may enable an operator of the well (106) to assess a relatively current state of the well system (106), and make real-time decisions regarding development of the well system (106) and the reservoir (102), such as on-demand adjustments in regulation of production flow from the well.

The well sub-surface system (122) includes casing installed in the wellbore (120). For example, the wellbore (120) may have a cased portion and an uncased (or "open-hole") portion. The cased portion may include a portion of the wellbore having casing (e.g., casing pipe and casing cement) disposed therein. The uncased portion may include a portion of the wellbore not having casing disposed therein. In some embodiments, the casing includes an annular casing that lines the wall of the wellbore (120) to define a central passage that provides a conduit for the transport of tools and substances through the wellbore (120). For example, the central passage may provide a conduit for lowering logging tools into the wellbore (120), a conduit for the flow of production (121) (e.g., oil and gas) from the reservoir (102) to the surface (108), or a conduit for the flow of injection substances (e.g., water) from the surface (108) into the hydrocarbon-bearing formation (104). In some embodiments, the well sub-surface system (122) includes production tubing installed in the wellbore (120). The production tubing may provide a conduit for the transport of tools and substances through the wellbore (120). The production tubing may, for example, be disposed inside casing. In such an embodiment, the production tubing may provide a conduit for some or all of the production (121) (e.g., oil and gas) passing through the wellbore (120) and the casing.

The well surface system (124) includes a wellhead (130). The wellhead (130) may include a rigid structure installed at the "up-hole" end of the wellbore (120), at or near where the wellbore (120) terminates at the Earth's surface (108). The wellhead (130) may include structures for supporting (or "hanging") casing and production tubing extending into the wellbore (120). Production (121) may flow through the wellhead (130), after exiting the wellbore (120) and the well sub-surface system (122), including, for example, the casing and the production tubing. In some embodiments, the well surface system (124) includes flow regulating devices that are operable to control the flow of substances into and out of the wellbore (120). For example, the well surface system (124) may include one or more production valves (132) that are operable to control the flow of production (134). For example, a production valve (132) may be fully opened to enable unrestricted flow of production (121) from the wellbore (120), the production valve (132) may be partially opened to partially restrict (or "throttle") the flow of production (121) from the wellbore (120), and production valve (132) may be fully closed to fully restrict (or "block") the flow of production (121) from the wellbore (120), and through the well surface system (124).

The wellhead (130) includes a choke assembly. For example, the choke assembly may include hardware with functionality for opening and closing the fluid flow through pipes in the well system (106). Likewise, the choke assembly may include a pipe manifold that may lower the pressure of fluid traversing the wellhead. As such, the choke assembly may include set of high pressure valves and at least two chokes. These chokes may be fixed or adjustable or a mix of both. Redundancy may be provided so that if one choke has to be taken out of service, the flow may be directed through another choke. In some embodiments, pressure valves and chokes are communicatively coupled to the well control system (126). Accordingly, a well control system (126) may obtain wellhead data regarding the choke assembly as well as transmit one or more commands to components within the choke assembly in order to adjust one or more choke assembly parameters.

Keeping with FIG. 1, in some embodiments, the well surface system (124) includes a surface sensing system (134). The surface sensing system (134) may include sensors for sensing characteristics of substances, including production (121), passing through or otherwise located in the well surface system (124). The characteristics may include, for example, pressure, temperature and flow rate of production (121) flowing through the wellhead (130), or other conduits of the well surface system (124), after exiting the wellbore (120).

In some embodiments, the surface sensing system (134) includes a surface pressure sensor (136) operable to sense the pressure of production (151) flowing through the well surface system (124), after it exits the wellbore (120). The surface pressure sensor (136) may include, for example, a wellhead pressure sensor that senses a pressure of production (121) flowing through or otherwise located in the wellhead (130). In some embodiments, the surface sensing system (134) includes a surface temperature sensor (138) operable to sense the temperature of production (151) flowing through the well surface system (124), after it exits the wellbore (120). The surface temperature sensor (138) may include, for example, a wellhead temperature sensor that senses a temperature of production (121) flowing through or otherwise located in the wellhead (130), referred to as "wellhead temperature" ($T_{wh}$). In some embodiments, the surface sensing system (134) includes a flow rate sensor (139) operable to sense the flow rate of production (151) flowing through the well surface system (124), after it exits the wellbore (120). The flow rate sensor (139) may include hardware that senses a flow rate of production (121) ($Q_{wh}$) passing through the wellhead (130).

Figure 7:
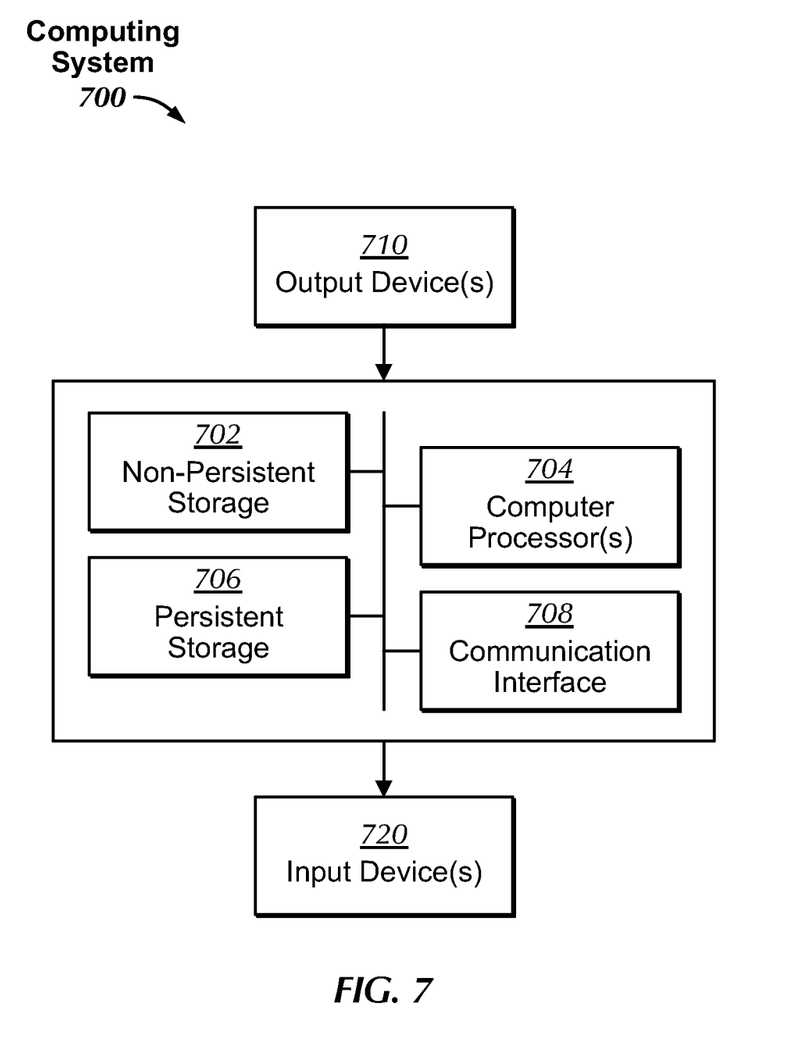
FIG. 7 shows a computer system in accordance with one or more embodiments.

In some embodiments, the well system (106) includes a reservoir simulator (160). For example, the reservoir simulator (160) may include hardware and/or software with functionality for generating one or more reservoir models regarding the hydrocarbon-bearing formation (104) and/or performing one or more reservoir simulations. For example, the reservoir simulator (160) may store well logs and data regarding core samples for performing simulations. A reservoir simulator may further analyze the well log data, the core sample data, seismic data, and/or other types of data to generate and/or update the one or more reservoir models. While the reservoir simulator (160) is shown at a well site, embodiments are contemplated where reservoir simulators are located away from well sites. In some embodiments, the reservoir simulator (160) may include a computer system that is similar to the computer system (800) described below with regard to FIGS. 7A and 7B and the accompanying description.

A reservoir simulator may include functionality for solving well equations and reservoir equations separately, e.g., using Additive Schwartz methods. When the number of wells in a simulation is relatively small, computation time spent solving well equations may be a small fraction of the total computation time. However, in massive full-field simulations, where hundreds or thousands of wells are being simulated, the total computation time for solving well equations may increase considerably. This may be particularly true when a multi-segment well model is used as the number of unknown well parameters to be solved may be much larger than a conventional well model. As such, reservoir simulators may assign wells to computer processes in parallel computing tasks statically and/or dynamically. For example, at the beginning of a reservoir simulation, a well may be assigned to a single computer process that performs the computations necessary for this well. In some embodiments, placement of a well within a computer process may be independent of grid partitioning, e.g., whether the well is surrounded by fine-grid cells or coarsened grid blocks. During a simulation, a computer process may access both grid data for a reservoir model and well data. As such, well assignment may affect such parallel communication patterns and thereby may influence reservoir simulation performance.

In some embodiments, well assignment for parallel computer processes may include the case where a number of wells being simulated is greater than the number of computer processes involved in a reservoir simulation. Thus, multiple wells may be assigned to one computer process operating within a parallel processing stage. As wells may not need to be solved at all times during a reservoir simulation, e.g., only when the wells are producing or injecting, a situation may occur where one computer process is solving equations for multiple wells while a production well assigned to another computer process is inactive causing the computer process to be idle (i.e., waiting for the other computer processes to finish in the parallel processing stage).

Figure 2:
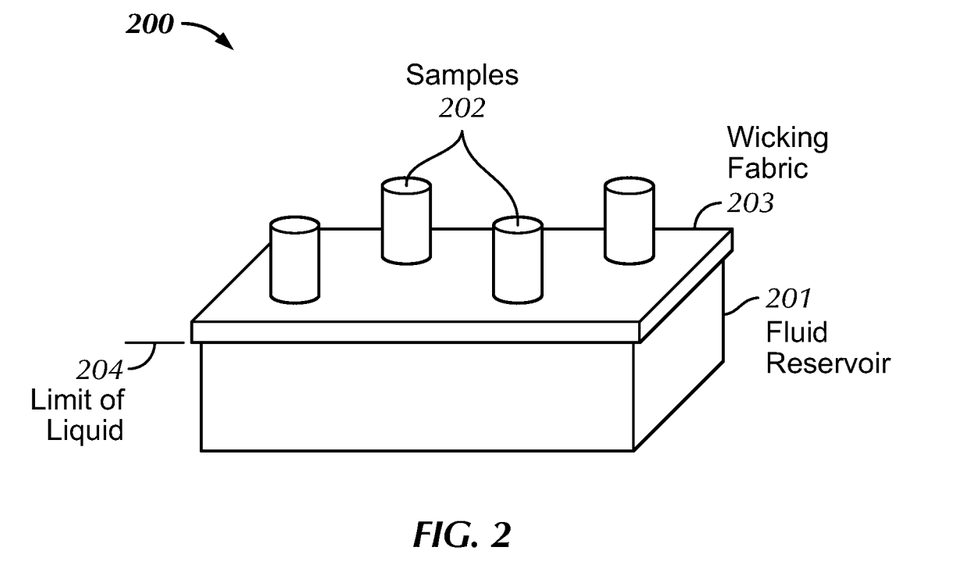
FIG. 2 shows a fluid reservoir for imbibition in accordance with one or more embodiments.

Turning to FIG. 2, FIG. 2 shows a schematic diagram in accordance with one or more embodiments. In one or more embodiments, one or more of the modules and/or elements shown in FIG. 2 may be omitted, repeated, and/or substituted. Accordingly, embodiments of the invention should not be considered limited to the specific arrangements of modules and/or elements shown in FIG. 2.

As shown in FIG. 2, FIG. 2 illustrates a spontaneous imbibition set (200) containing a fluid reservoir (201), rock samples (202), a wicking fabric (203) and an imbibition fluid (204). In particular, the spontaneous imbibition is a process of absorbing fluid (204) into a porous rock (202) by capillary action, without an influence of external factors, including pressure. The spontaneous imbibition occurs when the fluid (204) rapidly occupies the more permeable regions of the pore space, such as the fractures.

In one or more embodiments, the spontaneous imbibition set (200) may be set up in way that the imbibition fluid (204) from the fluid reservoir (201) is introduced to the rock samples (202) on one end. The fluid (204) and the rock samples (202) may not be in direct contact. They may be separated by the wicking fabric (203), which uses capillarity to transfer the imbibition fluid (204) to the rock samples (202). The imbibition process, based on the rock samples and the fractures, may take from two months to up to a year. Additionally or alternatively, the spontaneous imbibition set (200) may involve the fluid reservoir (201) being attached to sample holder, where the imbibition fluid (204) in the sample holder is equal to the fluid level in the reservoir (201). In another example, the rock sample (202) may be wrapped in a Teflon sleeve and the imbibition fluid (204) is introduced at one end via a fluid vessel. Yet another alternative may include putting the rock sample (202) in a traditional pressure flow cell and apply static pressure on one end of the rock sample (204).

Figure 3:
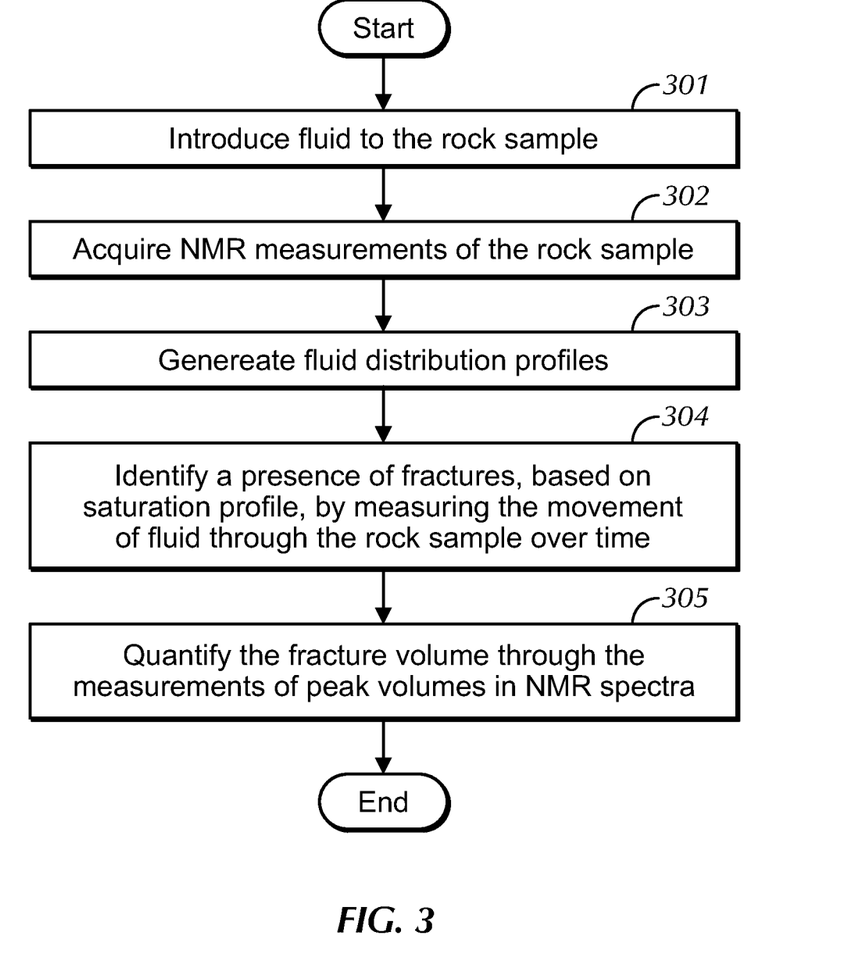
FIG. 3 shows a flowchart in accordance with one or more embodiments.

FIG. 3 shows a flowchart in accordance with one or more embodiments. Specifically, FIG. 3 describes a method for analyzing unconventional rock. While the various blocks in FIG. 3 are presented and described sequentially, one of the ordinary skill in the art will appreciate that some or all of the block may be executed in a different order, may be combined or omitted, and some or all of the blocks may be executed in parallel. Furthermore, the block may be performed actively or passively.

Initially in Block 301, a rock sample is saturated with a fluid. The rock sample may be a core sample obtained from the reservoir by drilling. For example, the rock sample may be rock core plugs as shown in FIG. 2 above. The rock sample represents characteristics of the reservoir rocks. The fluid may be, for example, oil, water, brine solution, etc. In one or more embodiments, the fluid spontaneous imbibes into the sample, using for example a set up such as that shown in FIG. 2.

In Block 302, a set of Nuclear magnetic resonance (NMR) measurements of the rock sample is acquired. Any configuration with a hydrogen signal may be used in a traditional low field NMR system. Other nuclei spins may also be used, including at least fluorine and sodium. When the rock sample imbibes fluid, NMR data is acquired on the sample at different times of fluid imbibition to track the fluid change (both temporal changes and spatial changes) in the sample.

In Block 303, a fluid distribution profiles are generated based on a $T_2$ behavior of the NMR measurements. The $T_2$ represents transverse relaxation time and it is dependent on fluid type, pore size and proximity to paramagnetic centers. It is responsible for the relaxation of the components of the magnetization vector perpendicular to the magnetic field. The $T_2$ behavior may be expressed as the following equation:

$$\frac{1}{T_2} = \rho \frac{A}{V} + \frac{1}{T_{2b}} \quad \text{Eq. (1)}$$

In the equation Eq. (1), $\rho$ denotes a surface relaxivity, A denotes surface area, V denotes a volume of the pore, and $T_{2b}$ denotes a bulk relaxation.

The first term of the Eq. (1) is the decay due to surface relaxation. The second term is the bulk relaxation. If the fluid is in a large space, such as a fracture, the fluid relaxation behaves more like bulk, and this will be the dominating term. In contrast, if the fluid is in a tight confined space, such as the small pore, the spin relaxes quickly from the dominant surface relaxation. However, the relaxation in Eq. (1) depends on the paramagnetic nature of the surface of the fracture and/or pore. The above clarification is true when the density of paramagnetic centers on fracture surfaces is comparable to the pore surface. In certain rocks, the density of paramagnetic centers on the fracture surface may be extremely high, therefore the fluid in the fracture may relax even faster than in the pores which has a nominal amount of paramagnetic centers on the surface.

The use of NMR imaging to determine the fluid distribution profiles allows a more confident prediction of fractures in tight rocks and further determination of the extent of the fractures. The plots of the NMR saturation profiles of the core may be obtained before saturation and then at multiple points after saturation. The plot may be obtained by placing the rock sample in the NMR and applying a SPRITE DHK sequence. As the fluid increases in the sample, it may be possible to determine the location of the fluid using this sequence, where the y-axis is location.

In Block 305, quantification of the fractures volume is determined through the measurements of the peak volumes in NMR $T_2$ spectra. Using the saturation profiles from Block 304 and $T_2$ spectra, the volume of fluid in the fracture may be determined by quantifying the area under the curve. Using, for example, MATLAB's deconvolution function it is possible to deconvolve all the $T_2$ spectra at different imbibition times into multiple Gaussian shapes. The deconvolution of the value under the short peak is used to calculate the amount of fluid in the fracture. This may be further useful in interpreting permeability results on these samples.

Figure 4A:
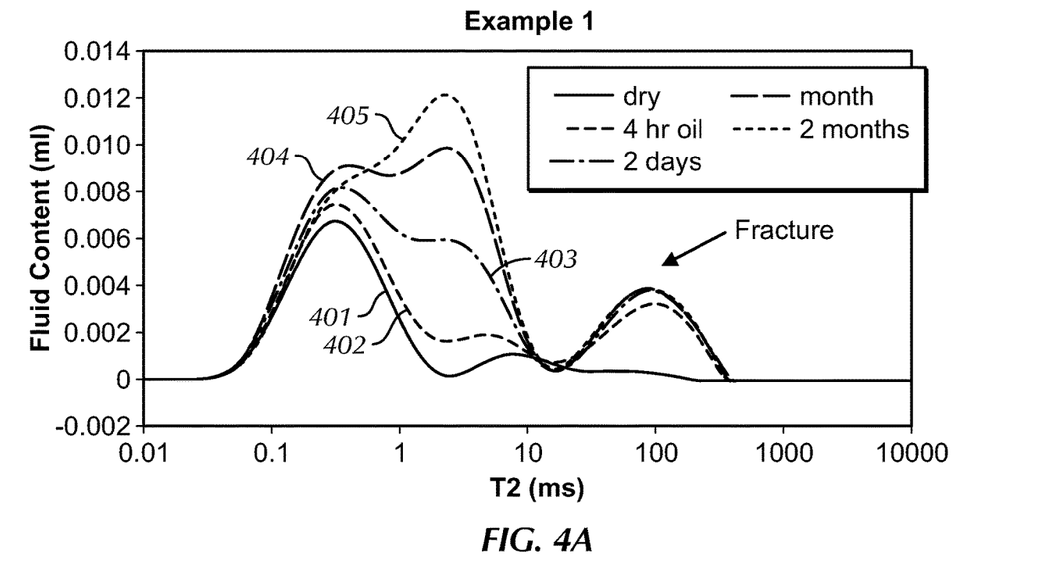
FIGS. 4A-4B show examples of NMR $T_2$ spectra in accordance with one or more embodiments.
Figure 4B:
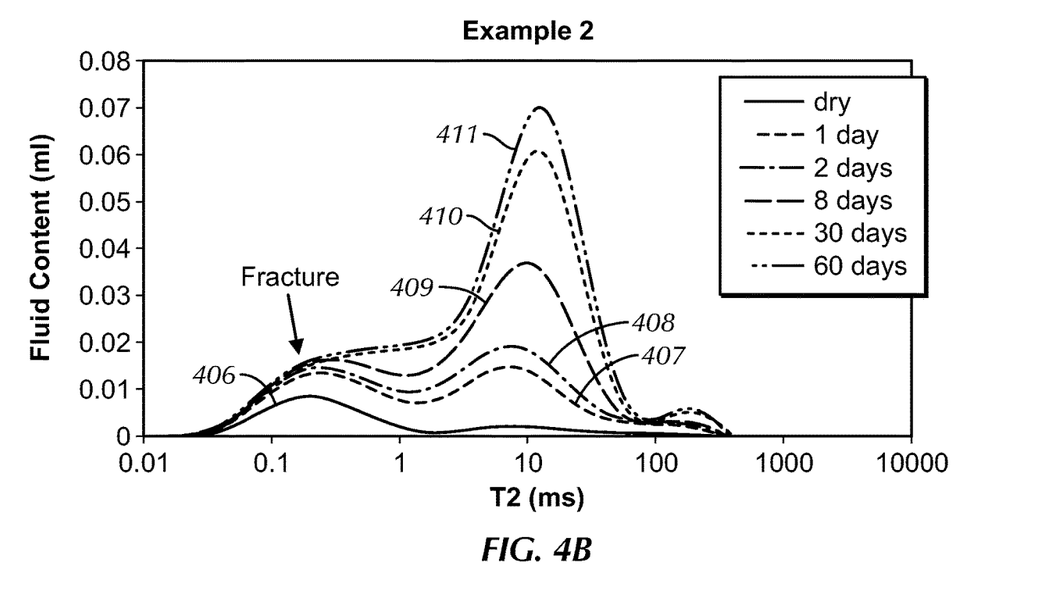

FIGS. 4A and 4B show a NMR transverse relaxation time ($T_2$) spectra diagrams in accordance with one or more embodiments. In FIGS. 4A and 4B, both graphs show samples containing fractures. The NMR data is initially obtained before exposing the rock samples (202) to the imbibition fluid (204). After the exposure to the imbibition fluid (204), the NMR data of rock samples (202) is obtained at different time intervals during the two months long examination.

As shown in FIG. 4A, the NMR data of a rock sample is plotted when the rock sample is dry (401) and in time intervals 4 hours (402), 2 days (403), 30 days (404) and 60 days (405) after imbibition. A differences between the plots of dry and imbibed states are compared to examine if the fractures in the rock sample exist. The plots of different imbibition times are roughly following the trend of the dry plot (401) for the first 10 milliseconds (ms), where fluid fills the pore at approximately 5 ms. Although the difference between the plots exists, it is gradual and it is possible to notice the gradual transformation from the plot of the dry state (401) to the plot of after 60 days (405). However, at 100 ms, there is a significant discrepancy between the dry plot (401) and the plots of all other time intervals. Unlike the dry plot (401), which doesn't show any major changes of the trend, the rest of the plots (402-405) are showing a rapid increase. Further, the increase of the slope is same for the plots 402-405. That means that the fluid managed to make a quick progress through a rock sample, which signifies a fracture. Hence, the presence of a fracture at 100 ms may be confirmed. Further, it may be concluded that a rock sample from FIG. 4A has fractures with a density of paramagnetic centers comparable to that on the pore surface. Therefore, the peak at 100 ms is from spaces with large aperture and is from the fracture fluid. This peak increased rapidly in the first 2 days and changed very little afterwards because the fractures are saturated with the imbibed fluid in a short time.

Turning to FIG. 4B, the NMR data of a rock sample is plotted when the rock sample is dry (406) and in time intervals 1 day (407), 2 days (408), 8 days (409), 30 days (410) and 60 days (411) after imbibition. In FIG. 4B the fracture surface has a much higher density of paramagnetic material present than on the pore surface. This causes a faster relaxation in the fractures, even though the aperture is much larger than the pores. The plots of different imbibition times have an increase in peak volume between 0.1 ms and 1 ms. Having a simultaneous increase in the volume, again, signifies a fracture in that time period. Additionally, in FIG. 4B there is an overlap with a signal in the dry sample related to bound hydrocarbons, which may be subtracted to get correct volume.

Figure 5A:
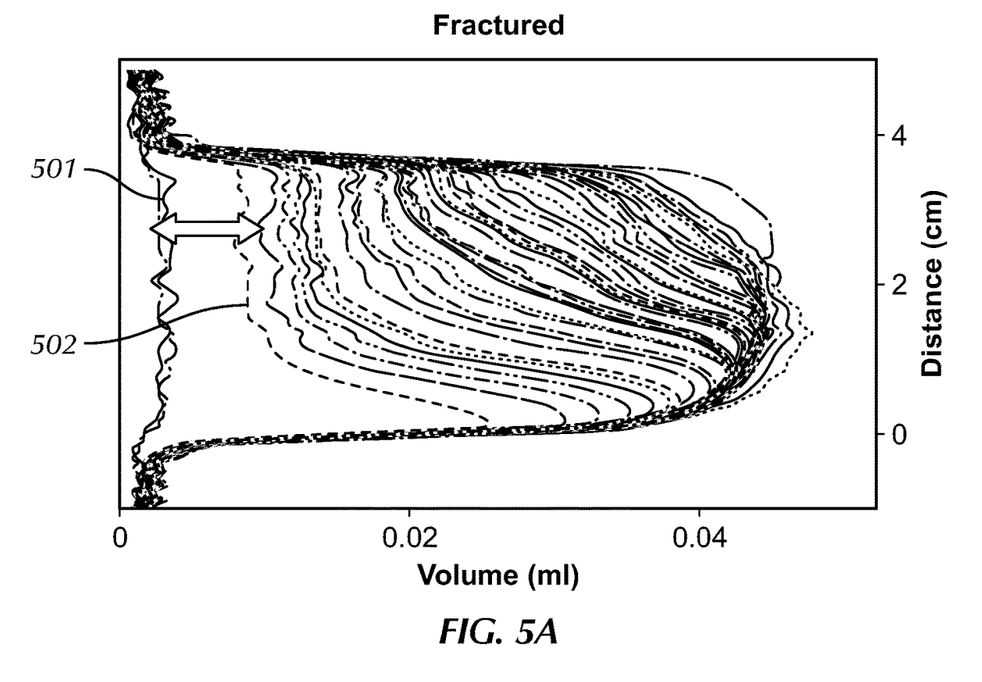
FIGS. 5A-5C show examples of saturation profiles of a rock in accordance with one or more embodiments.
Figure 5B:
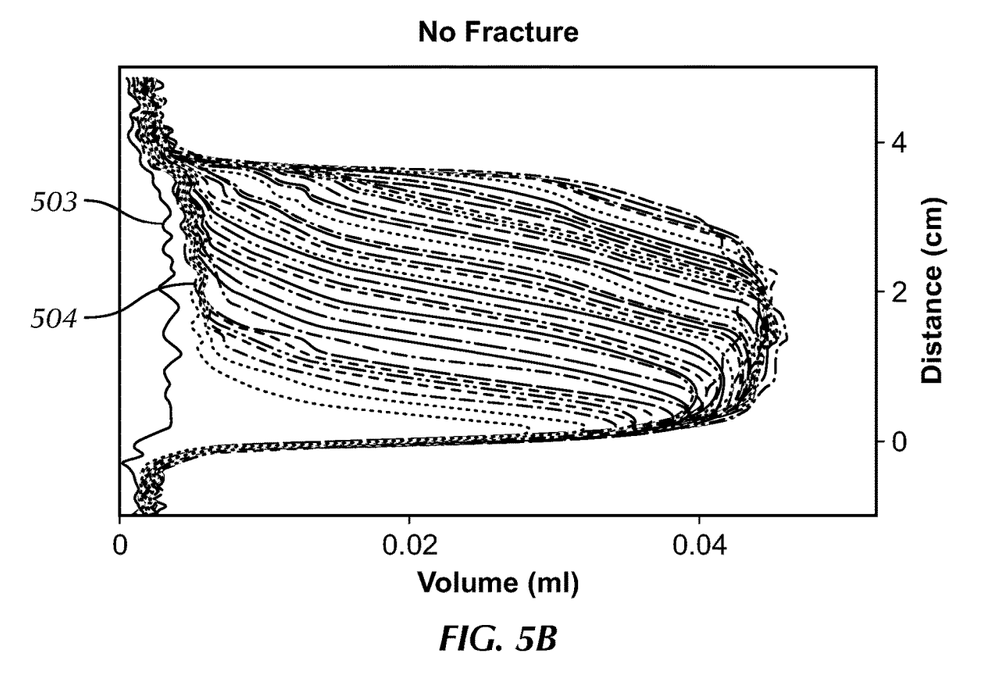
Figure 5C:
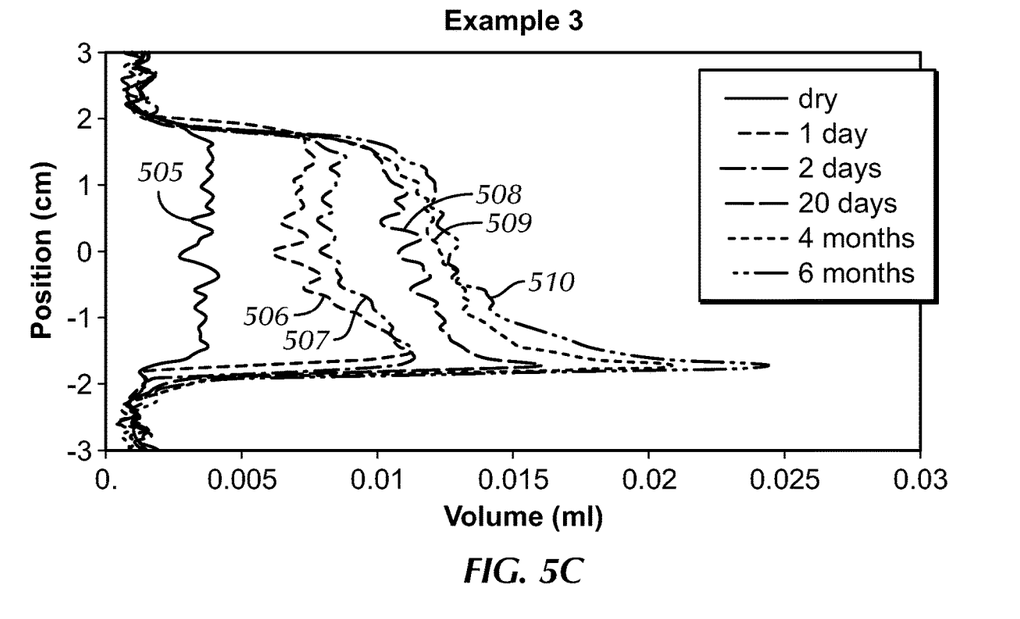

Turning to FIGS. 5A, 5B and 5C, FIGS. 5A, 5B and 5C show diagrams of the NMR saturation profiles, obtained of the rock sample before a saturation and then at multiple points after saturation, in accordance with one or more embodiments. FIGS. 5A and 5B show examples of saturation profiles. The plot is obtained by placing the sample in the NMR and applying the SPRITE DHK sequence. As the fluid increases in the sample we are able to determine the location of the fluid using SPRITE DHK sequence, where the y-axis is a location.

In FIG. 5A the volume of fluid is plotted along the entire length of the rock sample before and after being exposed to fluid. The noticeable gap is present between the plot of the dry rock sample (501) and the plot two days after the imbibition process had started (502). The gap spreads throughout the entire graph and that indicates that a fracture exists along the entire length of the rock sample. In FIG. 5B there is no significant gap between the plot of the dry rock sample (503) and the plots after the imbibition process had started (504). The fluid is moving as a slow front from the bottom of the core, with no change at the top of the sample, indicating no fracture pathway. However, it may be possible that a small amount of fracture fluid is still present, due to the small gap.

FIG. 5C shows another example of the saturation profile. There is a significant gap between the plot of the dry sample (505) and plot of day 1 (506). As the graph shows, the fluid initially increases along the full length of the sample, because it traveled quickly through a fracture. The fluid then moves from the fracture, into the rock, and, as the result, the volume increases across the rock with time. The fluid front has formed on the bottom of the sample from the fluid moving through the pore system. The fluid in fracture may be quantified by determining the area between the plot of the dry sample (505) and plot of day 1 (506). Additionally, a gap is present between the plot of day 2 (507) and a plot of day 20 (508). However, this gap is not associated with a fracture due to the significant time difference between these two plots. There is no gap between the plots of day 20 (508), two months (509), and 6 months (510).

Figure 6A:
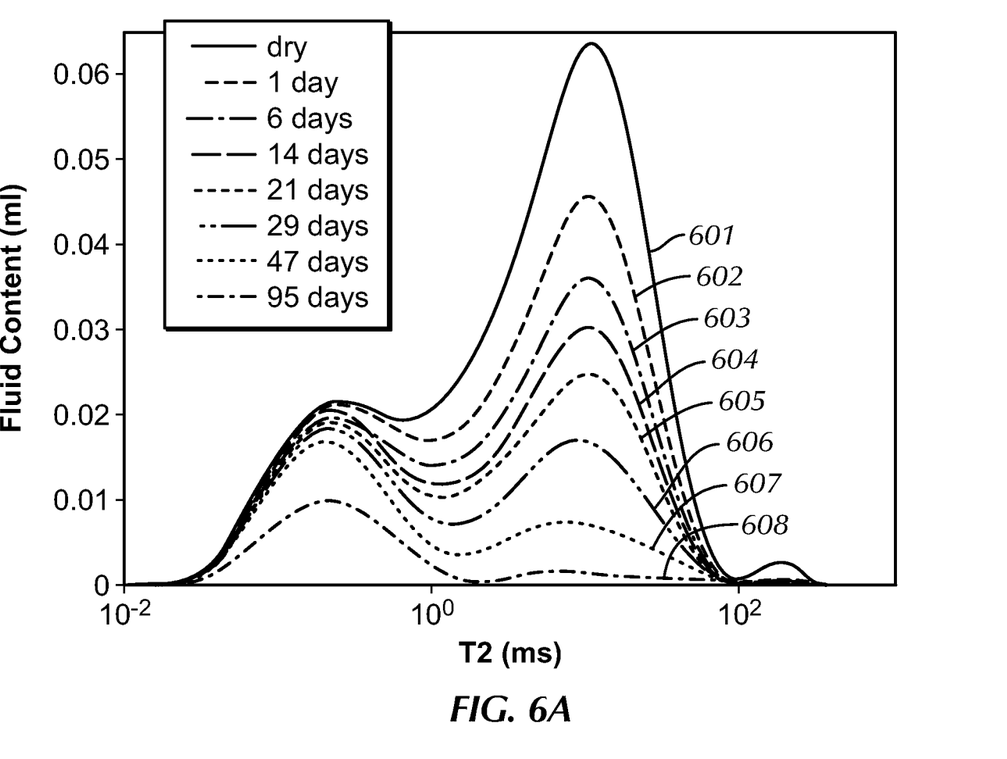
FIGS. 6A-6B show examples of measurement of the peak volumes in NMR $T_2$ spectra in accordance with one or more embodiments.
Figure 6B:
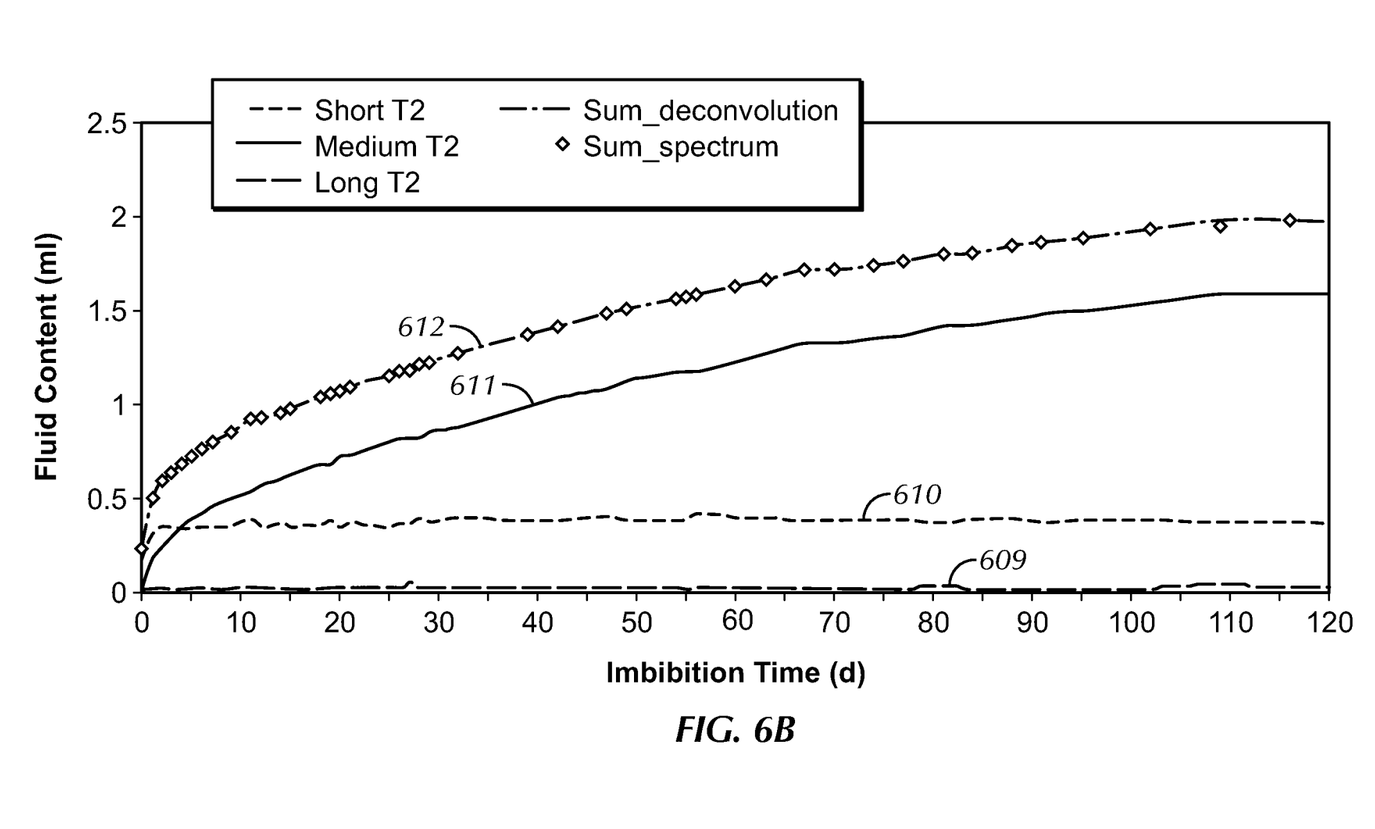

Turning to FIGS. 6A and 6B, FIG. 6A shows example $T_2$ spectra with oil imbibed over 95 days and FIG. 6B shows the peak area of 3 different $T_2$ values from Gaussian deconvolution of the NMR $T_2$ spectra at different oil imbibition times, in accordance with one or more embodiments.

FIG. 6A shows a $T_2$ spectra of a sample that was dried at 108° C. under vacuum for 72 hours. The $T_2$ spectra of the rock sample is plotted when the rock sample is dry (601) and in time intervals 1 day (602), 6 days (603), 14 days (604), 21 days (605), 29 days (606), 47 days (607) and 95 days (608), after the imbibition process had started. This procedure did not remove all the fluids in the source rock but did remove the fluids in the sample fractures. Oil was then introduced to one end of the sample and the fluid imbibition was tracked by NMR as shown in FIG. 6A. The quantification of the fracture volume is accomplished through the measurement of the peak volumes in NMR $T_2$ spectra. Combining the saturation profiles and $T_2$ spectra, the volume of fluid in the fracture may be determined by quantifying the area under the curve. The short $T_2$ value peak at approximately 0.22 ms increases predominately during the day one (602) and then maintains approximately the same content with longer imbibition time. In order to perform deconvolution calculations, MATLAB's built-in deconvolution function may be used to deconvolve all the $T_2$ spectra at different imbibition times into multiple Gaussian shapes.

In FIG. 6B the peaks with $T_2$ of short (609), medium (610), and long (611) values, were plotted together with the summation (612) of the three components is the depicted as. This plot clearly shows the fluid increase for the short $T_2$ value peak only occurs at short imbibition times and thus may only be attributed to fracture, which has the capability to rapidly imbibe the fluid. The short value (609), which is the deconvolution of the value under the short peak, may be used calculate the amount of fluid in the fracture. For this sample it leads to a fracture porosity of 0.64 pu. Based on this method, it is possible to quantify the fracture porosity/pore volume and the NMR $T_2$ signature from NMR measurement of oil imbibition. This may be further useful in interpreting permeability results on these samples.

Embodiments may be implemented on a computing system. Any combination of mobile, desktop, server, router, switch, embedded device, or other types of hardware may be used. For example, as shown in FIG. 7, the computing system (700) may include one or more computer processors (704), non-persistent storage (702) (e.g., volatile memory, such as random access memory (RAM), cache memory), persistent storage (706) (e.g., a hard disk, an optical drive such as a compact disk (CD) drive or digital versatile disk (DVD) drive, a flash memory, etc.), a communication interface (708) (e.g., Bluetooth interface, infrared interface, network interface, optical interface, etc.), and numerous other elements and functionalities.

The computer processor(s) (704) may be an integrated circuit for processing instructions. For example, the computer processor(s) may be one or more cores or micro-cores of a processor. The computing system (700) may also include one or more input devices (720), such as a touchscreen, keyboard, mouse, microphone, touchpad, electronic pen, or any other type of input device.

The communication interface (708) may include an integrated circuit for connecting the computing system (700) to a network (not shown) (e.g., a local area network (LAN), a wide area network (WAN) such as the Internet, mobile network, or any other type of network) and/or to another device, such as another computing device.

Further, the computing system (700) may include one or more output devices (710), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (704), non-persistent storage (702), and persistent storage (706). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

While the disclosure has been described with respect to a limited number of embodiments, those skilled in the art, having benefit of this disclosure, will appreciate that other embodiments may be devised which do not depart from the scope of the disclosure as disclosed herein. Accordingly, the scope of the disclosure should be limited only by the attached claims.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A method for analyzing unconventional rock samples, the method comprising:
   introducing fluid to a rock sample;
   acquiring, by a computer processor, nuclear magnetic resonance (NMR) measurements of the rock sample to track fluid change in the rock sample;
   calculating transverse relaxation time ($T_2$) based on the NMR measurements;
   generating, by the computer processor and based on an NMR imaging, fluid distribution profiles, the fluid distribution profiles representing a movement of the fluid; and
   obtaining, by the computer processor and based on the NMR imaging, a quantification of fracture volume, the quantification of the fracture volume representing an amount of fluid in a fracture.

2. The method of claim 1, further comprising:
   identifying a presence of fractures in the rock sample by measuring movement of the fluid through the rock sample over time;
   predicting an extent of the fractures in the rock sample by determining fluid distribution profiles of the fluid; and
   quantifying the fracture volume through a measurement of at least one fracture fluid peak in an NMR spectrum.

3. The method of claim 1, wherein the rock sample is dried in vacuum before acquiring NMR measurements.

4. The method of claim 1, wherein the fluid is introduced to the rock sample on one end, using a spontaneous imbibition.

5. The method of claim 1, wherein the NMR imaging is obtained at time intervals to track spatial and temporal changes in the rock sample.

6. The method of claim 1, wherein the transverse relaxation time ($T_2$) is obtained from a decay due to surface relaxation and bulk relaxation.

7. The method of claim 1, wherein a Carr Purcell Meiboom Gill (CPMG) sequence is used to acquire NMR imaging at different imbibition time.

8. The method of claim 1, wherein the fracture volume is obtained through a measurement of peak volumes by calculating an area under the curve in NMR $T_2$ spectra.

9. A computer system for analyzing unconventional rock samples, comprising:
   a processor; and
   a memory coupled to the processor, the memory storing instructions, when executed,
      comprising functionality for:
      acquiring nuclear magnetic resonance (NMR) measurements of a rock sample;
      generating, based on NMR imaging, fluid distribution profiles, the fluid distribution profiles representing a movement of the fluid in the rock sample; and
      obtaining, based on NMR imaging, a quantification of fracture volume, the quantification of the fracture volume representing the amount of the fluid in a fracture of the rock sample.

10. The computer system of claim 9, further comprising:
    identifying a presence of fractures in a rock sample by measuring movement of fluid through the rock sample over time;
    predicting an extent of the fractures in the rock sample by determining fluid distribution profiles of the fluid; and
    quantifying the fracture volume through a measurement of peak volumes in NMR spectra.

11. The computer system according to claim 9, further comprising:
    generating, by inversion of the NMR measurements, a spatial transverse relaxation time ($T_2$) distribution; and
    generating, based on the spatial $T_2$ distribution, a saturation profile representing distribution of the fluid stored in the rock sample.

12. The computer system of claim 11, wherein a NMR saturation profile may be obtained, by a computer processor and based on NMR imaging, using SPRITE DHK sequence.

13. The computer system of claim 11, wherein the location of the fluid is determined by examining the y-axis of the saturation profile plot.

14. The computer system of claim 9, wherein NMR imaging is obtained at time intervals to track spatial and temporal changes in the rock sample.

15. The method of claim 9, wherein the $T_2$ is obtained from a decay due to surface relaxation and a bulk relaxation.

16. The computer system of claim 9, wherein Carr Purcell Meiboom Gill (CPMG) sequence may be used to acquire NMR imaging at different imbibition time.

17. The computer system of claim 9, wherein the fracture volume is obtained through a measurement of peak volumes by calculating area under the curve in NMR $T_2$ spectra.

18. A non-transitory computer readable medium storing instructions executable by a computer processor for analyzing unconventional rock samples, the instructions, when executed by the computer processor, comprising functionality for:
    acquiring nuclear magnetic resonance (NMR) measurements of the rock sample;

generating, based on NMR imaging, a fluid distribution profiles, the fluid distribution profiles representing a movement of a fluid front; and obtaining, based on NMR imaging, a quantification of fracture volume, the quantification of the fracture volume representing the amount of the fluid in a fracture.

19. The non-transitory computer readable medium of claim 18, further comprising:

identifying a presence of fractures in a rock sample by measuring movement of fluid through the rock sample over time;

predicting an extent of the fractures in the rock sample by determining fluid distribution profiles of the fluid; and quantifying the fracture volume through a measurement of peak volumes in NMR spectra.

20. The non-transitory computer readable medium according to claim 18, further comprising:

generating, by inversion of the NMR measurements, a spatial transverse relaxation time ($T_2$) distribution; and generating, based on the spatial $T_2$ distribution, the saturation profile representing distribution of the fluid stored in the rock sample.

\* \* \* \* \*